(12) United States Patent
Suzuki

(10) Patent No.: US 7,151,417 B1
(45) Date of Patent: Dec. 19, 2006

(54) SYSTEM AND METHOD FOR CHARACTERIZING A POTENTIAL DISTRIBUTION

(75) Inventor: Shingo Suzuki, San Jose, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

(21) Appl. No.: 10/870,754

(22) Filed: Jun. 16, 2004

(51) Int. Cl.
*H03L 1/00* (2006.01)
(52) U.S. Cl. .................. 331/185; 331/57; 331/186
(58) Field of Classification Search .............. 331/57, 331/185, 186
See application file for complete search history.

(56) References Cited

U.S. PATENT DOCUMENTS 6,104,254 A * 8/2000 Iravani .................. 331/57
6,927,619 B1 * 8/2005 Doyle .................. 327/534
2002/0140456 A1 * 10/2002 Mizuno et al. ............ 326/81

* cited by examiner

Primary Examiner—Joseph Chang

(57) ABSTRACT

An apparatus for characterizing an operating parameter in an integrated circuit, in accordance with one embodiment of the present invention, includes a voltage potential module, a plurality of distribution systems and a plurality of ring oscillator modules. Each ring oscillator module is coupled to the voltage potential module by a respective distribution system. Each ring oscillator module generates an oscillator signal as a function of the voltage potential and a voltage drop caused by the respective distribution system. The characterization of the operating parameter may be extrapolated from the difference in the operating frequencies of the ring oscillator modules.

35 Claims, 8 Drawing Sheets

(TOP VIEW)

(SIDE-SECTIONAL VIEW)

US 7,151,417 B1

SYSTEM AND METHOD FOR CHARACTERIZING A POTENTIAL DISTRIBUTION

BACKGROUND OF THE INVENTION

One challenge facing the designers of integrated circuits is validating a design rule utilized in a simulation model with a fabricated structure. Determining characteristics of the fabricated structure, such as impedance and pinch-off of a back-bias voltage distribution system, with increased precision enables selection of an appropriate design rule. Selection of appropriate design rule for use in a given simulation model facilitates the design of high performance integrated circuits.

Another challenge facing the designers of integrated circuits is determining various operating parameters in an integrated circuit. Determining operating parameters, such as the voltage level of a back-bias potential at a given location on the integrated circuit, with increased precision enables adjustment of the operating parameters to achieve a desired level of performance.

Without the ability to determine characteristics of a fabricated structure and/or operating parameters with increased precision, it is necessary to design integrated circuits using conservative design conditions. These conservative design conditions typically result in moderate performance of the integrated circuits.

SUMMARY OF THE INVENTION

Accordingly, embodiments of the present invention are directed toward a system and method for characterizing a parameter of an integrated circuit. In one embodiment, a system for characterizing a potential distribution system includes a voltage potential module, a plurality of distribution systems and a plurality of ring oscillator modules. Each ring oscillator module is coupled to the voltage potential module by a respective distribution system. Each ring oscillator module generates an oscillator signal as a function of the voltage potential and a voltage drop caused by the respective distribution system.

In another embodiment, a method of validating a design for use in fabricating an integrated circuit includes forming a plurality of test structures. Each test structure is formed according to a design rule. Each of a plurality of ring oscillator modules is coupled to a respective one of the plurality of test structures. The operating frequency of each ring oscillator module is a function of the design rule applied to the corresponding test structure.

In another embodiment, a method of determining a parameter in an integrated circuit includes distributing a potential. A first oscillator signal is generated as a function of the potential reduced by a first voltage drop. A second oscillator signal is generated as a function of the potential reduced by a second voltage drop. The first and second voltage drops are related to a parameter of the integrated circuit. An output signal may be generated as a function of a difference between the operating frequencies of the first and second oscillator signals.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
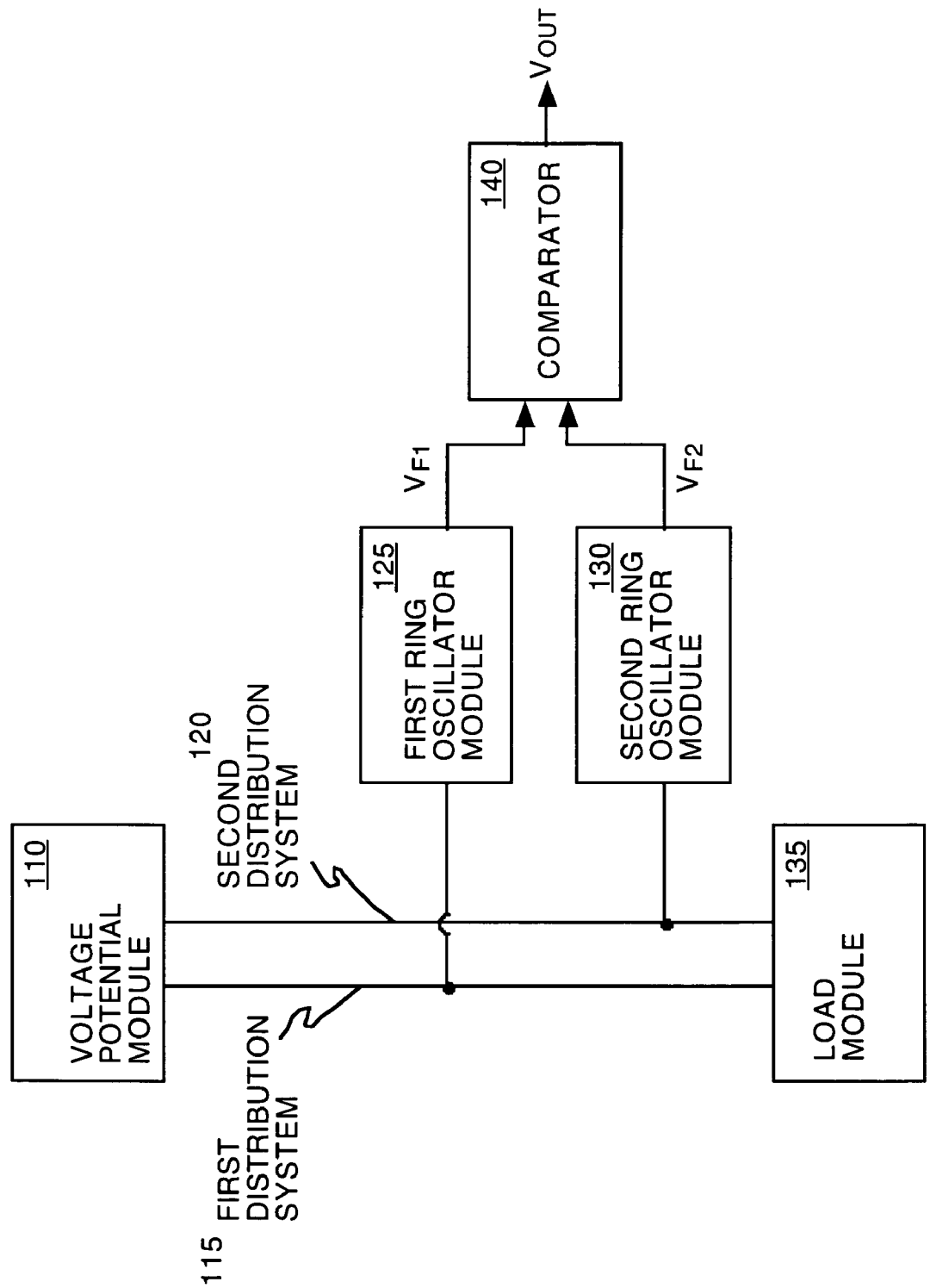
FIG. 1 shows a block diagram of a system for characterizing a potential distribution system, in accordance with one embodiment of the present invention.

Referring to FIG. 1, a block diagram of a system for characterizing a potential distribution system, in accordance with one embodiment of the present invention, is shown. The system may be utilized in conjunction with an integrated circuit, a test structure on a test chip, or the like. As depicted in FIG. 1, the system includes a voltage potential module 110, a first distribution system 115, a second distribution system 120, a first ring oscillator module 125 a second ring oscillator module 130 and a load module 135. The first ring oscillator module 125 may be coupled to the voltage potential module 110 by the first distribution system 115. The second ring oscillator module 130 may be coupled to the voltage potential module 110 by the second distribution system 120. The load module 135 may be coupled to the voltage potential module 110 by the first and second distribution systems 115, 120 such that a load current is drawn through each distribution system 115, 120. The system may also include a comparator module 140 coupled to the first ring oscillator module 125 and the second ring oscillator module 130.

In one implementation, the voltage potential module 110 may be a reference voltage generator, a back-bias voltage generator or the like. In one implementation, the first distribution system 115 may be a grid of heavily doped silicon (e.g., deep n-well), a substrate, a network of heavily doped polysilicon and/or the like buried interconnect. In one implementation, the second distribution system 120 may be a network of heavily doped polysilicon, metal and/or the like surface interconnect. In one implementation, the load module 135 may be a representative load, core circuitry or the like. In one implementation, each ring oscillator module 125, 130 may be a leakage current ring oscillator module as described below with reference to FIG. 2, an inverter chain ring oscillator module as described below with reference to FIG. 3, or the like.

The load current flowing in each distribution system 115, 120 results in a potential drop as a function of the respective impedance of the first and second distribution systems 115, 120. Accordingly, the voltage potential received at the first ring oscillator module 125 may be reduced by a first voltage drop. The voltage potential received at the second ring oscillator module 130 may be reduced by a second voltage drop. Each ring oscillator module 125, 130 generates an oscillator signal ($V_{F1}$, $V_{F2}$) having an operating frequency that is a function of the received potential. More specifically, the operating frequency of the first ring oscillator module 125 is a function of the received first potential. The received first potential is equal to the potential output by the voltage potential module 110 reduced by the first voltage drop introduced by the first distribution system 115. The operating frequency of the second ring oscillator module 130 is a function of the received second potential. The received second potential is equal to the potential output by the voltage potential module 110 reduced by the second voltage drop introduced by the second distribution system 120.

Thus, the operating frequencies of the first and second ring oscillator modules 125, 130 may be utilized to characterize differences in the distribution systems 115, 120. In one implementation, the comparator module 140 receives the first and second oscillator signals ($V_{F1}$, $V_{F2}$) generated by the first and second ring oscillator modules 125, 130. The comparator module 140 generates an output signal ($V_{OUT}$) as a function of the difference between the operating frequency of the first ring oscillator module 125 and the operating frequency of the second ring oscillator module 130. The output signal ($V_{OUT}$) may be utilized to extrapolate the impedance difference between the first distribution system 115 and the second distribution system 120.

Various embodiments of the comparator modules 140 are described in the following disclosures: U.S. patent application Ser. No. 10/712,847, filed Nov. 12, 2003, by Shingo Suzuki, entitled "A device Age Determination circuit," U.S. patent application Ser. No. 10/672,793, filed Sep. 26, 2003, by Shingo Suzuki, entitled "System and Method for Measuring Transistor Leakage Current with a Ring Oscillator with Back-bias Controls," and U.S. patent application Ser. No. 10/124,152, filed Apr. 16, 2002, by Shingo Suzuki et al., entitled "A System and Method for Measuring Transistor Leakage Current with a Ring Oscillator," which are incorporated herein by reference.

Figure 2:
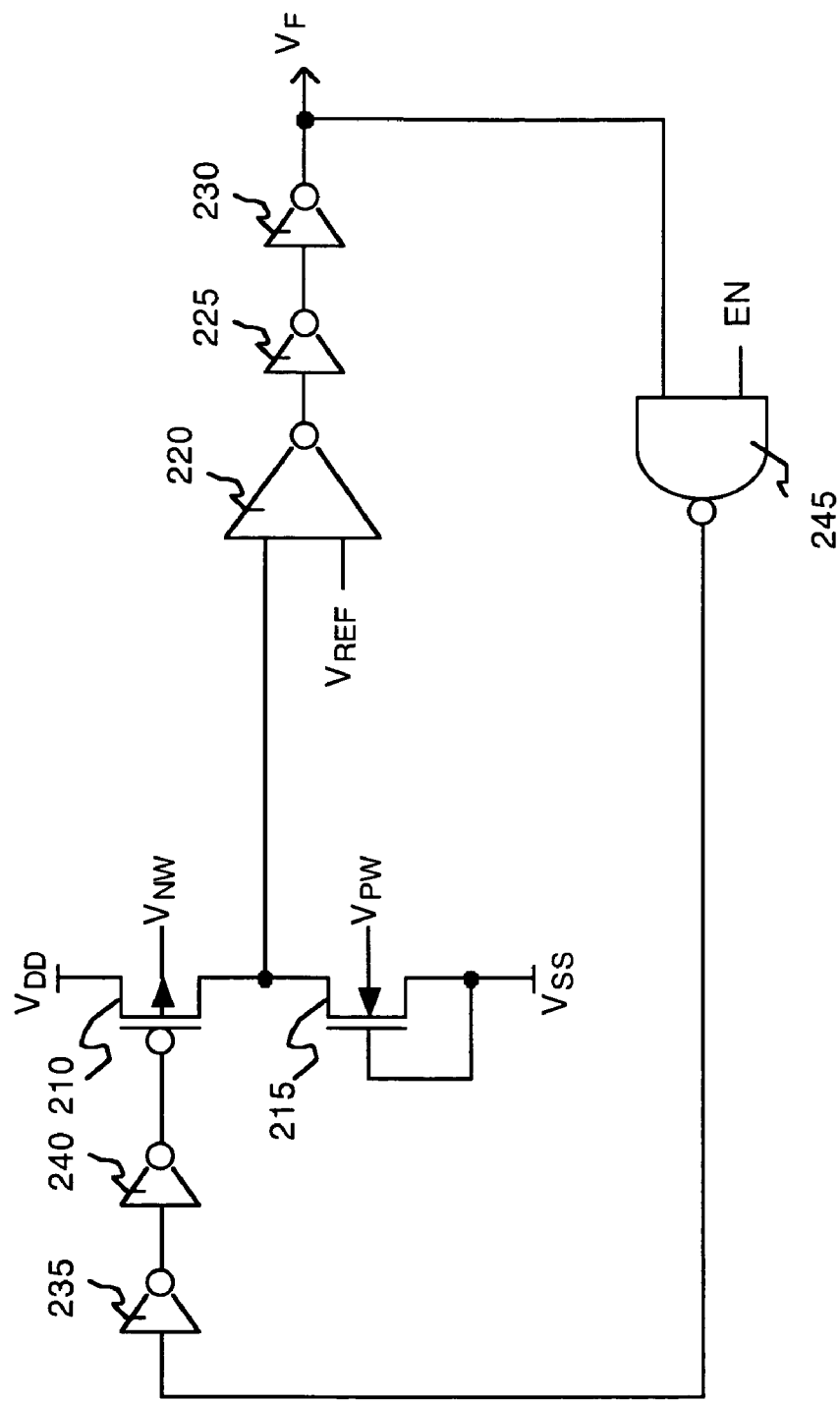
FIG. 2 shows a block diagram of an exemplary ring oscillator module, in accordance with one embodiment of the present invention.

Referring now to FIG. 2, a block diagram of an exemplary ring oscillator module, in accordance with one embodiment of the present invention, is shown. As depicted in FIG. 2, the exemplary ring oscillator module includes a first transistor 210, a second transistor 215, a differential amplifier 220 and a plurality of inverters 225–240. A source of the first transistor 210 may be coupled to a first potential (e.g., $V_{DD}$).

A body of the first transistor 210 may be coupled to a first back-bias potential (e.g., $V_{NW}$). A source and gate of the second transistor 215 may be coupled to a second potential (e.g., $V_{SS}$). A body of the second transistor 215 may be coupled to a second back-bias potential (e.g., $V_{PW}$). A drain of the first transistor 210 and a drain of the second transistor 215 may be coupled to a first input of the differential amplifier 220. A second input of the differential amplifier 220 may be coupled to a reference voltage ($V_{REF}$). The plurality of inverter stages 225–240 may be coupled in series with each other and form a signal loop from an output of the differential amplifier 220 to a gate of the first transistor 210. The ring oscillator module may also include a NAND gate 245 having a first input and an output coupled in series with the plurality of inverters 225–240. A second input of the NAND gate 245 may be coupled to an enable signal (EN). It is appreciated that the combination of the plurality of inverters 225–240, the NAND gate 245, the inverter composed of the first and second transistor 210, 215, and the differential amplifier 220 results in an odd number of logic state inversions of an oscillator signal propagating along the signal loop.

It is appreciated that the first and second transistor 210, 215 may be coupled as an inverter, such that the first transistor 210 acts as a charge device and the second transistor 215 acts as a leakage device. The first and second transistors 210, 215 may be a p-channel metal-oxide-semiconductor field effect transistor (P-MOSFET) and an n-channel metal-oxide-semiconductor field effect transistor (N-MOSFET), respectively.

In a first mode (e.g., disabled), the ring oscillator module does not generate an oscillator signal ($V_F$). More specifically, a low state enable signal (EN) is received at a first input of the NAND gate 245. When the first input of the NAND gate 245 is low, the output of the NAND gate 245 is high regardless of the state of the second input of the NAND gate 245. When the output of the NAND gate 245 is high, a corresponding logic state is maintained at each node in the signal loop.

In a second mode (e.g., enabled), the ring oscillator module generates a first oscillator signal ($V_{F1}$) as a function of the first and second potentials and the first and second back-bias voltages ($V_{NW}$, $V_{PW}$). More specifically, the differential amplifier 220 will generate a voltage at its output at a level such that the voltage at the first input of the differential amplifier 220 is substantially equal to the reference voltage level ($V_{REF}$) at the second input of the differential amplifier 220. Accordingly, assuming that the voltage level at the first input of the differential amplifier 220 is increasing past the level of the reference voltage ($V_{REF}$), the output of the differential amplifier 220 will transition from a high state (e.g., $V_{DD}$) to a low state (e.g., $V_{SS}$). After a brief propagation delay around the signal loop, the potential at the gate of the first transistor 210 will transition from a low state to a high state. When the potential at the gate of the first transistor 210 switches to the high state, the first transistor 210 will turn off (e.g., stop conducting between its source and drain). Although the second transistor 215 is biased to operate in the off state, a leakage current from the drain to the source will cause a discharge of the voltage level at the first input of the differential amplifier 220.

When the potential at the first input of the differential amplifier 220 decreases below the level of the reference voltage ($V_{REF}$) due to the leakage current through the second transistor 214, the output of the differential amplifier 220 will transition from the low state to the high state. After a brief propagation delay around the signal loop, the potential at the gate of the first transistor 210 will transition from the high state to the low state. When the potential at the gate of the first transistor 210 switches to the low state, the first transistor 210 will turn on (e.g., the drain of the first transistor will be pulled up toward the first potential). Thus, the voltage level at the first input of the differential amplifier 220 will charge up toward the first potential.

The output of differential amplifier 220 will therefore switch between the high and low state at a fixed frequency once a steady state is achieved. It is appreciated that the operating frequency of the ring oscillator module will be a function of the first and second potentials ($V_{DD}$, $V_{SS}$), the switching speed of the first transistor 210 and the leakage current of the second transistor 215. It is appreciated that the leakage current of the second transistor 215 may be decreased by increasing the second back-bias voltage ($V_{PW}$). It is also appreciated that the operating frequency of the oscillator signals ($V_F$) may be measured at any node in the ring oscillator.

Figure 3:
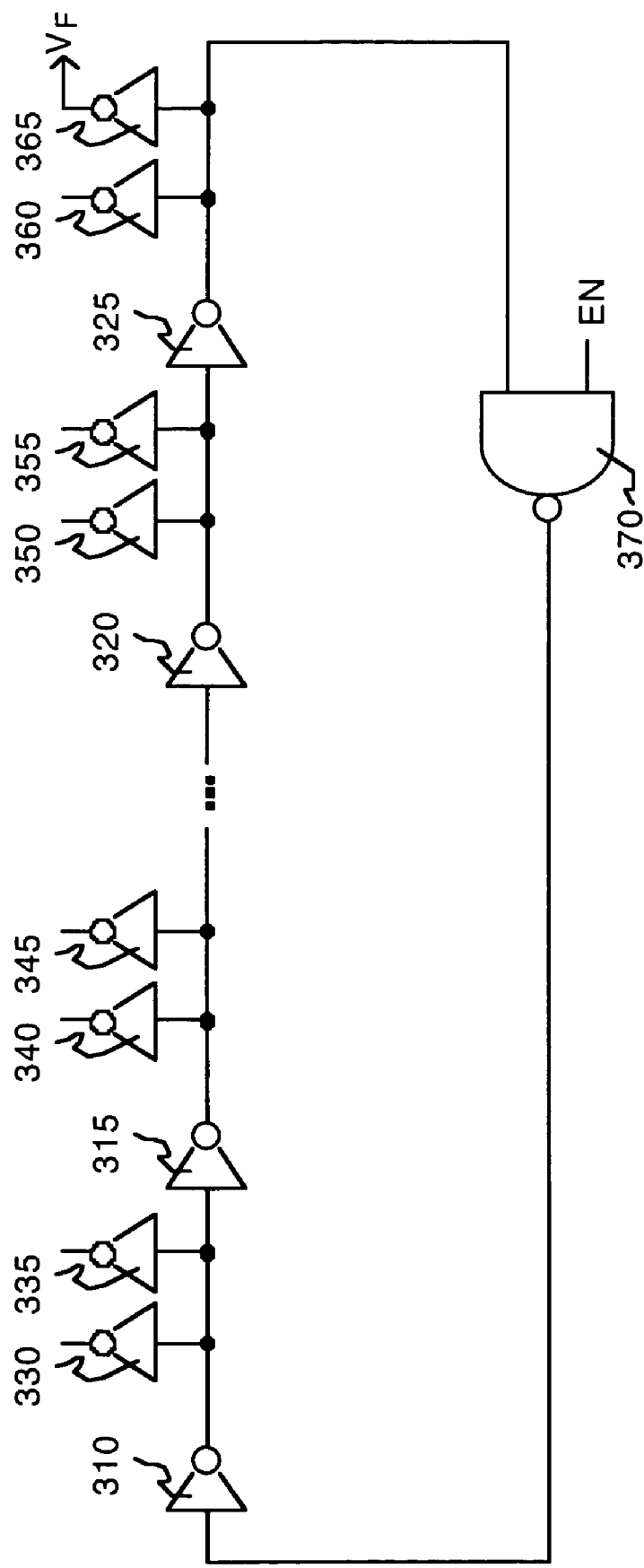
FIG. 3 shows a block diagram of another exemplary ring oscillator module, in accordance with one embodiment of the present invention.

Referring now to FIG. 3, a block diagram of another exemplary ring oscillator module, in accordance with one embodiment of the present invention, is shown. As depicted in FIG. 3, the exemplary ring oscillator module includes a first plurality of inverters 310–325 coupled in series with each other to form a signal loop. Each one of the first plurality of inverters 310–315 may have one or more load gates 330–365 coupled thereto for drawing an appropriate fan-out current. The exemplary ring oscillator module may also include a NAND gate 370 having a first input and an output coupled in between a first and second one of the first plurality of inverters 310–325. A second input of the NAND gate 270 may be coupled to an enable signal (EN). The combination of the first plurality of inverters 310–325 and the NAND gate 370 results in an odd number of logic state inversions of a first oscillator signal (VF) propagating along the signal loop. It is appreciated that a given one of the first plurality of inverters 315–325 or the NAND gate 370 also contributes to the fan-out current of the previous one of the first plurality of inverters 310–320.

In a first mode (e.g., disabled), the ring oscillator module does not generate a first oscillator signal ($V_{F1}$). More specifically, a low state enable signal (EN) is received at the first input of the NAND gate 370. When the first input of the NAND gate 370 is low, the output of the NAND gate 370 is at a high state regardless of the state of the second input of the NAND gate 370. Hence, the NAND gate 370 maintains a steady state around the first signal loop. It is appreciated that the second input of the NAND gate 370 will be at the high state when the output of the NAND gate 370 is maintained at the high state.

In a second mode (e.g., enabled), when the enable signal at the first input of the NAND gate 370 transitions from the low state to the high state the output of the NAND gate will transition to the low state. After a brief propagation delay around the signal loop, the state of the second input of the NAND gate 270 will transition to a low. Thus, the output of the NAND gate will transition to a high state which will in turn propagate around the signal loop. Accordingly, the output, taken at any node, will switch between the high and low states at a fixed frequency once a steady state is achieved. It is appreciated that the operating frequency of the ring oscillator module will be a function of the supply potential (e.g., $V_{DD}$, $V_{SS}$) of the circuit (not shown). It is also appreciated that the operating frequency of the ring oscillator may also be a function of back-bias voltages (e.g., $V_{NW}$, $V_{PW}$) of the transistors utilized to implement the inverters 210–325 (not shown).

Figure 4:
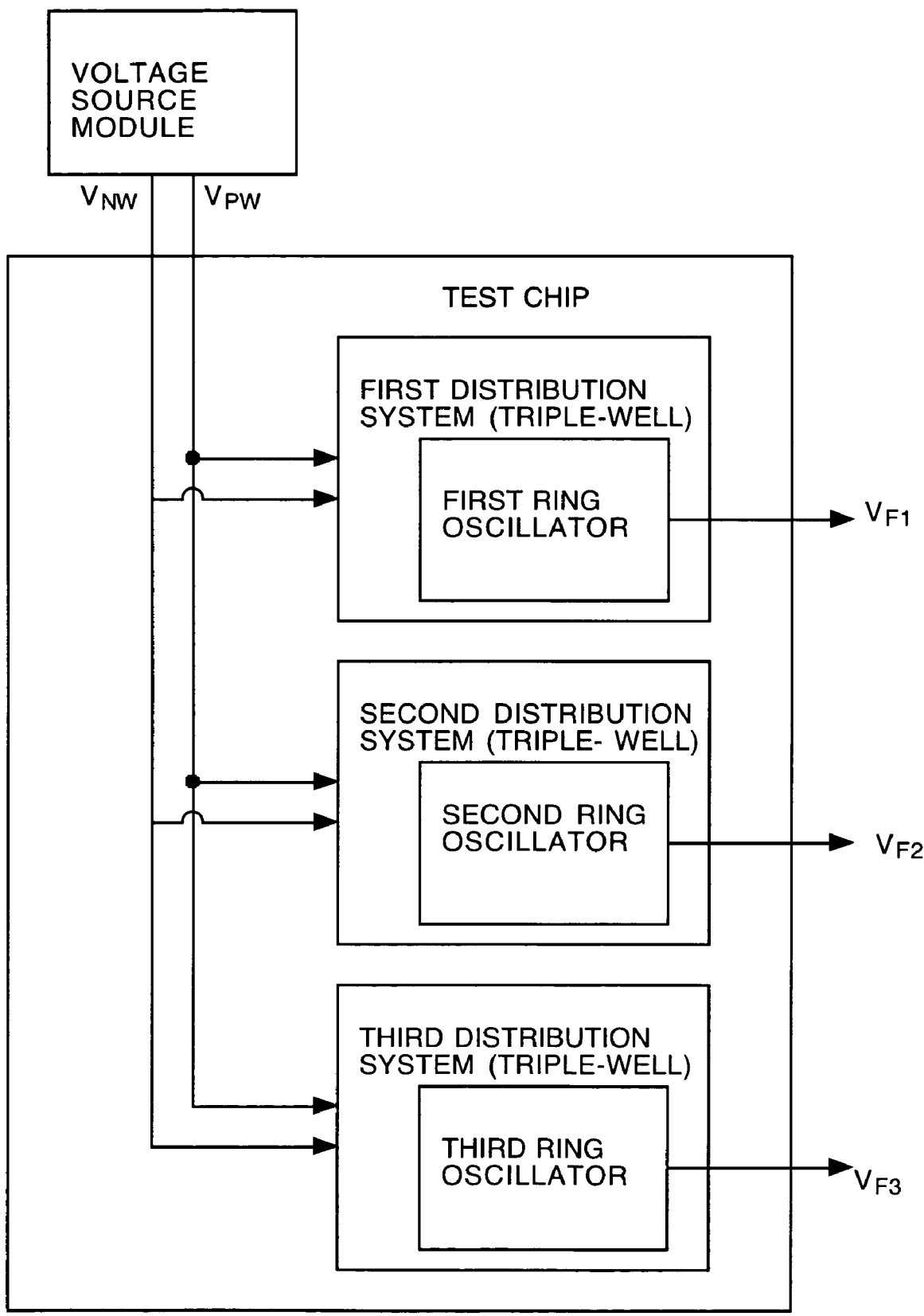
FIG. 4 shows a block diagram of a test structure for validating a design of an integrated circuit, in accordance with one embodiment of the present invention.

Referring now to FIG. 4, a block diagram of a test structure for validating a design of an integrated circuit, in accordance with one embodiment of the present invention, is shown. As depicted in FIG. 4, the test structure (e.g., test chip) includes a plurality of distribution systems for receiving one or more potentials. The test structure also includes a plurality of ring oscillator modules. Each ring oscillator module is coupled to a respective distribution system. Each distribution system is formed according to a respective design rule. In one implementation, each ring oscillator module is fabricated in a respective distribution system.

Figure 5A:
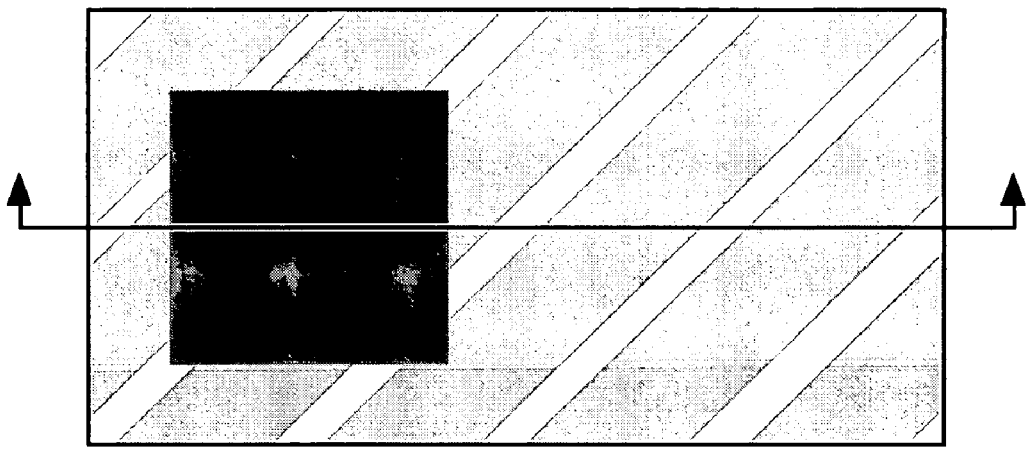
FIGS. 5A and 5B show a top view and side-sectional view of an exemplary back-bias distribution design, in accordance with one embodiment of the present invention.
Figure 5B:
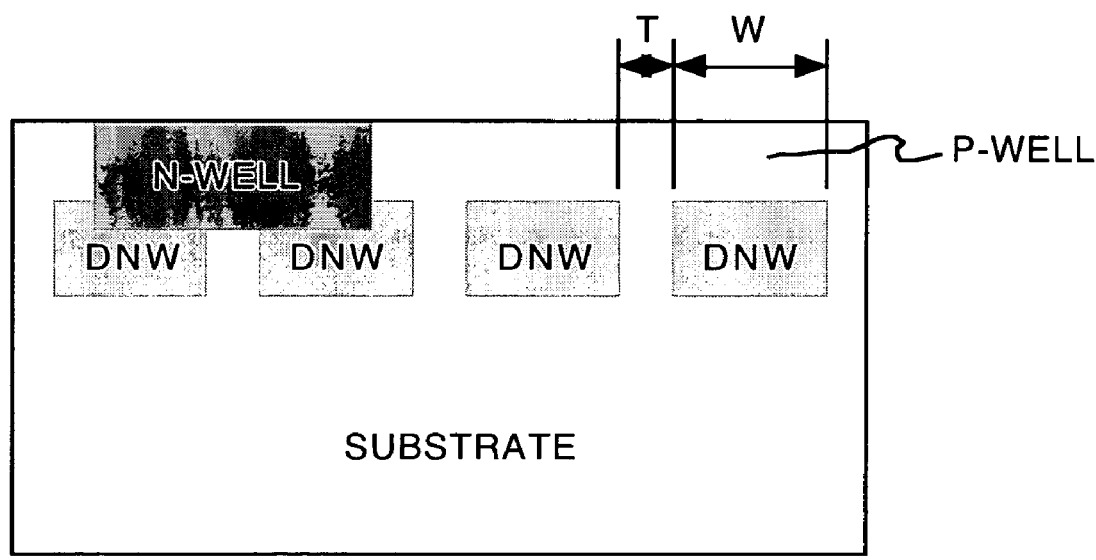

For example, each distribution system may be a triple-well structure as depicted in FIGS. 5A and 5B. FIGS. 5A and 5B illustrate a top view and side-sectional view of an exemplary back-bias distribution design (e.g., distribution system) to be validated by the system. An n-well bias potential (e.g., bias potential for a body of a P-MOSFET) may be distributed to one or more n-well regions utilizing a deep n-well (DNW). A p-well bias potential (e.g., bias potential for a body of an N-MOSFET) may be distributed utilizing a substrate. It is appreciated that a portion of the p-doped substrate forms one or more p-well regions.

The DNW is formed as a grid of heavily doped silicon regions. Each heavily n-doped silicon region has a width of W. Each heavily n-doped silicon region is separated from each other (e.g., by the p-doped substrate) by a distance of T. It is appreciated that the width, W, of each heavily doped silicon region should be as large as possible, while the spacing, T, between regions should be minimized. However, if the spacing, T, between heavily n-doped silicon regions is too small, the contact between the substrate and the p-well region may be pinched-off by the depletion region formed between the DNW and the substrate. When the contact region between the substrate and the p-well is pinched-off, the p-well biasing is no longer distributed by the substrate.

Each distribution system is coupled to an n-well bias voltage and a p-well bias voltage (VPW). The n-well bias potential and p-well bias potentials may be generated by a back-bias generator external to the test chip (shown) or internal to the test chip (not shown). Each ring oscillator module is fabricated in a respective triple-well. A first triple-well structure includes a first DNW grid having a width of W1 and a spacing of T1. A second triple-well structure includes a second DWN grid having a width of W2 and a spacing of T2. A third triple-well structure includes a third DWN grid having a width of W3 and a spacing of T3 and third ring oscillator module fabricated in the third triple-well structure.

Referring again to FIG. 4, the design rule of each distribution system may result in a variation of the potential delivered to the ring oscillator module by the corresponding distribution system. The operating frequency of each ring oscillator module will therefore be a function of the potential delivered by the respective distribution system. Thus, the operating frequency of the ring oscillator modules may be utilized to characterize the design rule.

Figure 6:
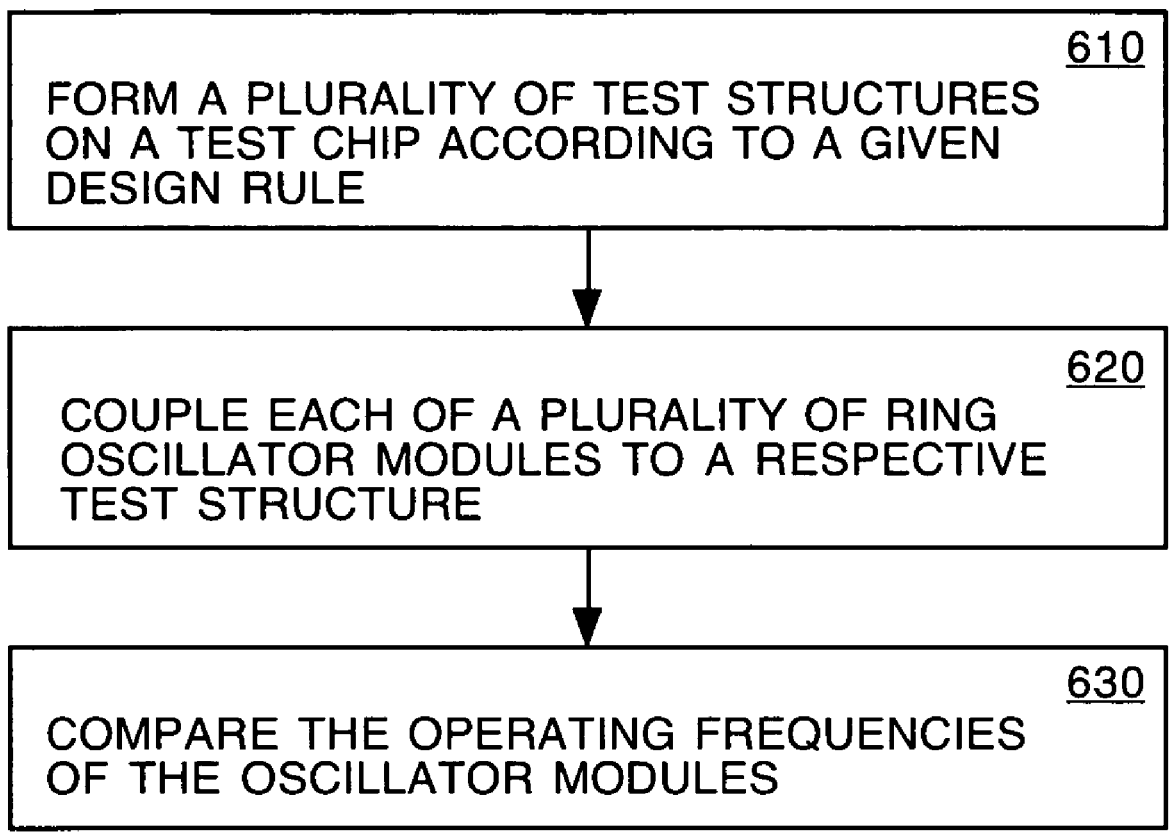
FIG. 6 shows a flow diagram of steps of a method of validating a design rule for use in fabrication of an integrated circuit, in accordance with one embodiment of the present invention.

Referring now to FIG. 6, a flow diagram of steps of a method of validating a design rule for use in fabrication of an integrated circuit, in accordance with one embodiment of the present invention, is shown. As depicted in FIG. 6, the method begins with forming a plurality of test structures, at 610. Each test structure is formed according to a given design rule. In one implementation, each test structure may be a triple-well structure wherein one or more parameters, such as a feature size, are varied. For example, each triple-well structure may include an n-well implanted in a substrate, a deep n-well implanted in the substrate below the first n-well and a p-well portion of the substrate. The deep n-well (e.g., buried layer) may be utilized to distribute an n-well bias voltage to the n-well, and the substrate may be utilized to distribute a p-well bias voltage to the p-well. The deep n-well may be formed in a grid pattern below both the n-well and the p-well region as shown in FIG. 5. The width, W, of the segments of the n-well and/or the spacing, T, between segments may be varied in each test structure.

In another implementation, a first test structure may be a conventional single-well structure. An exemplary single-well structure may include an n-well implanted in a substrate and a p-well portion of the substrate. The substrate may be utilized to distribute the p-well bias voltage to the p-well and a metal or polysilicon interconnect layer may be utilized to distribute the n-well bias voltage to the n-well. The single-well structure may be utilized as a reference test structure to validate one or more other test structures which may be for example triple-well structures each formed according to a given design rule.

At 620, each one of a plurality of ring oscillator modules is coupled to a corresponding one of the plurality of test structures. The ring oscillator modules are coupled to the test structures such that the operating frequency of the respective ring oscillator modules is a function of the design rule applied to the corresponding test structure. For example, the design rule applied to each test structure results in a different impedance in the n-well and/or p-well bias voltage distribution system of the test structures. Thus, the operating frequency of the ring oscillators will be a function of the impedance of the distribution system of each test structure. In one implementation, fabricating each ring oscillator module in a corresponding test structure effectively couples the ring oscillator module to the corresponding test structure.

At 630, the operating frequency of each ring oscillator module is compared to the operating frequency of a reference ring oscillator module or to values calculated from design simulation. Thus, design simulations of each test structure may be validated against actual fabricated test structures.

Figure 7:
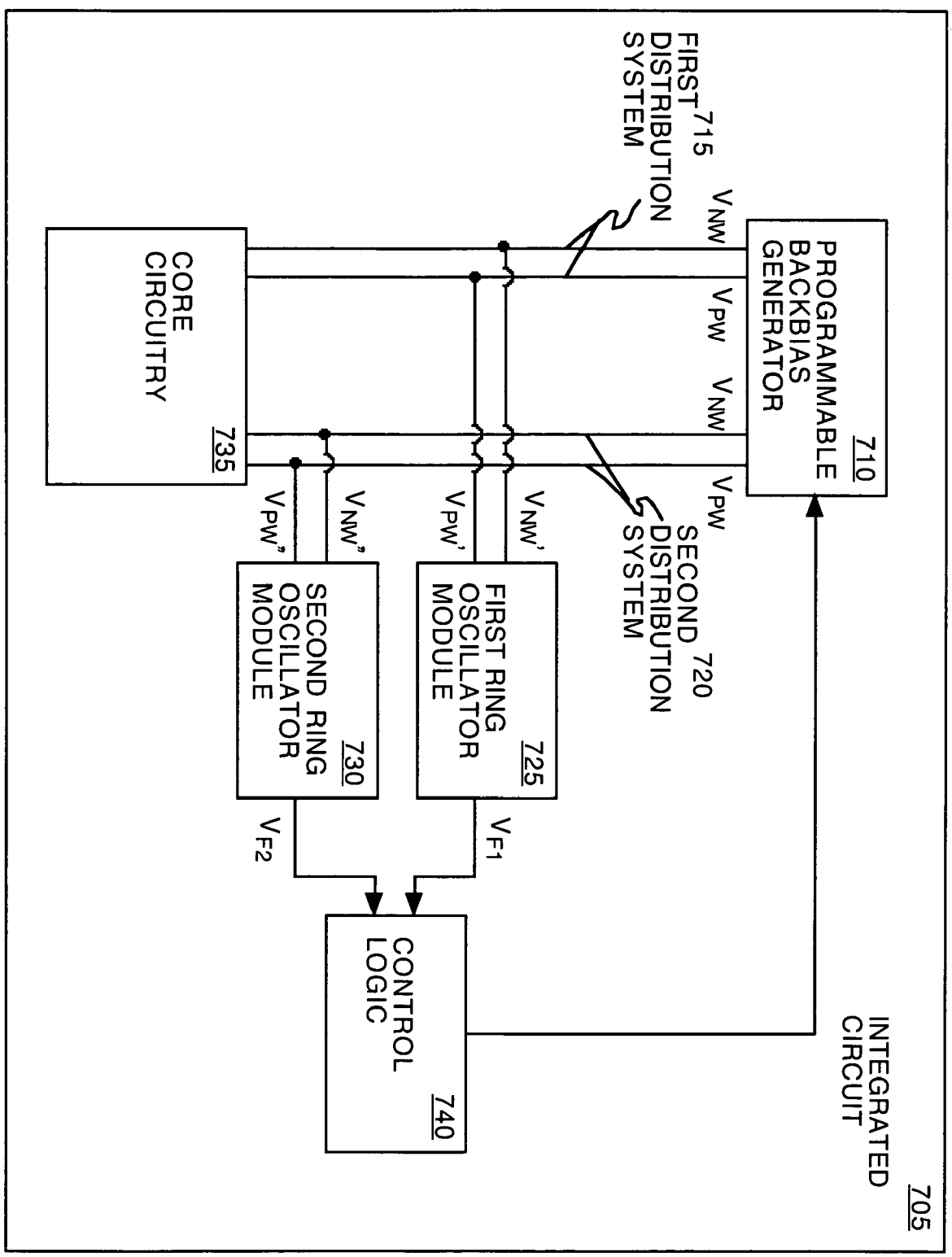
FIG. 7 shows a block diagram of a system for controlling a back-bias voltage generator, in accordance with one embodiment of the present invention.

Referring now to FIG. 7, a block diagram of a system for controlling a back-bias voltage generator, in accordance with another exemplary embodiment of the present invention, is shown. As depicted in FIG. 7, the system includes a programmable back-bias generator 710, a first distribution system 715, a second distribution system 720 (e.g., reference distribution system), a first ring oscillator module 725, a second ring oscillator module 730 and control logic 740. The first ring oscillator module 725 may be coupled to the programmable back-bias generator 710 by the first distribution system 715. The second ring oscillator module 730 may be coupled to the programmable back-bias generator 710 by the second distribution system 720. The core circuitry 735 of the integrated circuit 705 may be coupled to the programmable back-bias generator 710 by the first and second distribution systems 715, 720 such that load currents are drawn through each distribution system 715, 720. The control logic 740 may be coupled between the output of the ring oscillator modules 725, 730 and the programmable back-bias generator 710.

In one implementation, an n-well bias voltage and a p-well bias voltage are generated by the programmable back-bias generator 710. In one implementation, the first distribution system 715 may be buried layers, such as a grid of heavily n-doped silicon (e.g., DNW) and a substrate. The second distribution system 720 may be surface layers, such as metal interconnects. The n-well and p-well bias voltages received at the first ring oscillator module 725 may be reduced by a first voltage drop and second voltage drop respectively. The n-well and p-well bias voltages received at the second ring oscillator module 730 may be reduced by a third voltage drop and fourth voltage drop respectively.

The operating frequency of the first ring oscillator module 725 is a function of the received n-well and p-well bias voltages (VNW', VPW'). The operating frequency of the second ring oscillator module 730 is a function of the received n-well and p-well bias voltages (VNW", VPW"). Accordingly, the operating frequency of the first ring oscillator module relative to the operating frequency of the second ring oscillator module may be utilized to adjust the n-well and/or p-well bias voltage generated by the programmable back-bias generator. In one implementation, the control logic receives the first and second oscillator signals generated by the first and second ring oscillator modules respectively. The control logic generates one or more control signals as a function of the difference between the operating frequency of the first ring oscillator module and the operating frequency of the second ring oscillator module. The control signal may be utilized to trim the generated n-well bias voltage and/or p-well bias voltage of the programmable back-bias generator.

Figure 8:
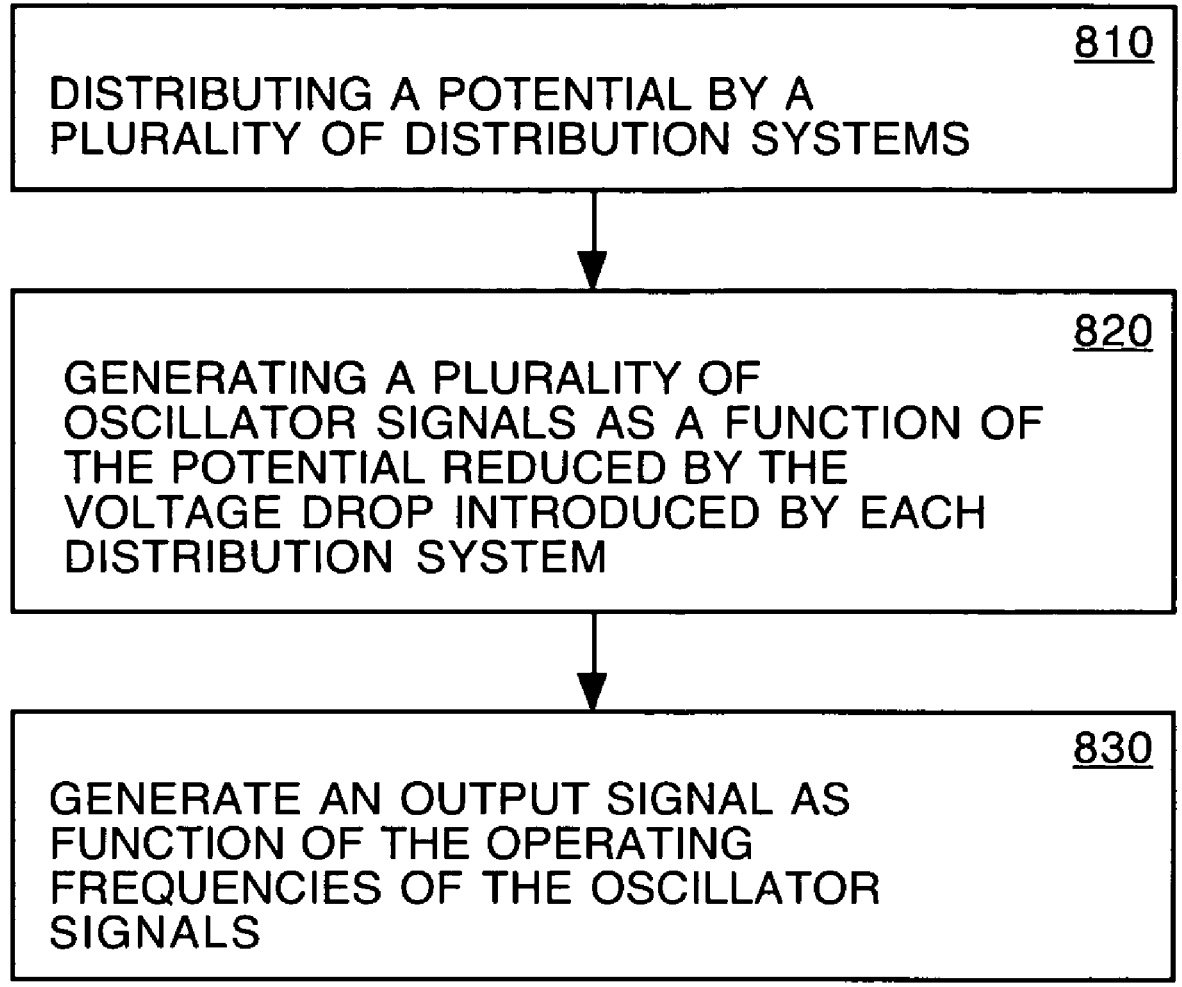
FIG. 8 shows a flow diagram of steps of a method of determining a parameter in an integrated circuit, in accordance with one embodiment of the present invention.

Referring now to FIG. 8, a flow diagram of steps of a method of determining a parameter in an integrated circuit, in accordance with one embodiment of the present invention, is shown. As depicted in FIG. 8, the method begins with distributing a potential by a plurality of distribution systems, at 810. Each distribution system results in the potential being reduced by a corresponding voltage drop. In one implementation, an n-well bias voltage and a p-well bias voltage are distributed by a plurality of systems, such as a buried layer (e.g., DNW) and a interconnect layer (e.g., metal). Each system of distributing the bias voltages results in a particular voltage drop in the as delivered voltage level of the bias voltages.

At 820, an oscillator signal is generated as a function of the potential reduced by the voltage drop introduced by each distribution system. In one implementation, the potential distributed by the buried layer is coupled to a first ring oscillator module and potential distributed by the interconnect layer is coupled to a second ring oscillator module. A first oscillator signal is generated by the first ring oscillator module as a function of the potential reduced by a first voltage drop introduced by the impedance of the buried layer. A second oscillator signal is generated by the second ring oscillator module as a function of the potential reduced by a second voltage drop introduced by the impedance of the interconnect layer.

At 830, an output signal is generated as a function of the operating frequency of the first oscillator signal and the operating frequency of the second oscillator signal. In one implementation, a control signal is generated as a function of the difference between the operating frequency of the first and second oscillator signals. The control signal may be utilized to trim the voltage levels of the n-well bias voltage and/or the p-well bias voltage.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An apparatus comprising:
a voltage potential module;
a first distribution system coupled to said voltage potential module;
a second distribution system coupled to said voltage potential module;
a first ring oscillator module coupled to said first distribution system, wherein a frequency of operation of said first ring oscillator module is variable as a function of a voltage potential delivered by said first distribution system and not a voltage potential delivered by said second distribution system;
a second ring oscillator module coupled to said second distribution system, wherein a frequency of operation of said second ring oscillator module is variable as a function of said voltage potential delivered by said second distribution system and not said voltage potential delivered by said first distribution system.

2. The apparatus of claim 1, further comprising a load module coupled to said first distribution system and said second distribution system.

3. The apparatus of claim 2, wherein said load module comprises a core circuitry.

4. The apparatus of claim 1, further comprising a comparator module coupled to said first ring oscillator module and said second ring oscillator module.

5. The apparatus of claim 1, further comprising a control logic module coupled to said first ring oscillator module, said second ring oscillator module and said voltage potential module.

6. The apparatus of claim 1, wherein said voltage potential module comprises a back-bias generator.

7. The apparatus of claim 1, wherein:
said first distribution system comprises a first triple-well structure; and
said second distribution system comprises a second triple-well structure.

8. The apparatus of claim 7, wherein:
said first triple-well structure comprises;
a first well disposed in a first portion of a substrate having a first doping type;
a first deep well disposed in said first portion of said substrate below said first well, coupled to said first well and having said first doping type; and
a second well disposed in said first portion of said substrate adjacent said first well and having a second doping type; and
said second triple-well structure comprises;
a third well disposed in a second portion of said substrate having said first doping type;
a second deep well disposed in said second portion of said substrate below said third well, coupled to said third well and having said first doping type; and
a fourth well disposed in said second portion of said substrate adjacent said third well and having said second doping type.

9. The apparatus of claim 7, wherein:
said first ring oscillator module is formed in said first triple-well structure; and
said second ring oscillator module is formed in said second triple-well structure.

10. The apparatus of claim 1, wherein:
said first distribution system comprises a triple-well structure, wherein a voltage potential is distributed by a buried layer of said triple-well structure; and
said second distribution system comprises a single-well structure, wherein a voltage potential is distributed by a metal interconnect of said single-well structure.

11. The apparatus of claim 10, wherein:
said triple well structure comprises;
a first well disposed in a first portion of a substrate having a first doping type;
a first deep well disposed in said first portion of said substrate below said first well, coupled to said first well and having said first doping type; and
a second well disposed in said first portion of said substrate adjacent said first well and having a second doping type; and
said single well structure comprises;
a third well disposed in a second portion of said substrate having said first doping type; and
said second portion of said substrate.

12. The apparatus of claim 10, wherein:
said first ring oscillator module is formed in said triple-well structure; and
said second ring oscillator module is formed in said single-well structure.

13. A system for characterizing a potential distribution system comprising:
a first distribution system for receiving a potential;
a first ring oscillator modules coupled to said first distribution system and not said second distribution system, for generating a first oscillator signal as a function of said potential and a first voltage drop across said first distribution system;
a second distribution system for receiving said potential; and
a second ring oscillator module, coupled to said second distribution system and not said first distribution system, for generating a second oscillator signal as a function of said potential and a second voltage drop across said second distribution system.

14. The system of claim 13, further comprising a voltage potential module for generating said potential.

15. The system of claim 13, further comprising a load module coupled to said first distribution system and said second distribution system and for generating said first voltage drop across said first distribution system and said second voltage drop across said second distribution system.

16. The system of claim 13, further comprising a comparator module coupled to said first ring oscillator module and said second ring oscillator module and for generating an output signal as a function of a difference between a first operating frequency of said first oscillator signal and a second operating frequency of said second oscillator signal.

17. The system of claim 16, wherein a characteristic of said first distribution system is extrapolated from said output signal.

18. The system of claim 13, wherein:
said first distribution system comprises a first triple-well structure, wherein said first potential is distributed by a first buried layer of said first triple-well structure; and
said second distribution system comprises a second triple-well structure, wherein said first potential is distributed by a second buried layer of said second triple-well structure.

19. The system of claim 18, wherein:
said first triple-well structure comprises;
- a first n-well disposed in a first portion of a substrate;
- a first p-well disposed in said first portion of said substrate adjacent said first n-well; and
- a first deep n-well disposed in said first portion of said substrate below said first n-well and said first p-well, wherein said first potential is distributed;

said second triple-well structure comprises;
- a second n-well disposed in a second portion of said substrate;
- a second p-well disposed in said second portion of said substrate; and
- a second deep n-well disposed in said second portion of said substrate below said second n-well and said second p-well, wherein said first potential is distributed; and said substrate distributes a second potential.

20. The system of claim 18, wherein:
said first ring oscillator module is formed in said first triple-well structure; and
said second ring oscillator module is formed in said second triple-well structure.

21. The system of claim 13, wherein:
said first distribution system comprises a triple-well structure, wherein said first potential is distributed by a buried layer of said first triple-well structure; and
said second distribution system comprises a single-well structure, wherein said first potential is distributed by an interconnect coupled to said single-well structure.

22. The system of claim 21, wherein:
said triple-well structure comprises;
- a first n-well disposed in a first portion of a substrate;
- a first p-well disposed in said first portion of said substrate adjacent said first n-well; and
- a first deep n-well disposed in said first portion of said substrate below said first n-well and said first p-well, wherein said first potential is distributed;

said single-well structure comprises;
- a second n-well disposed in a second portion of said substrate; and
- said second portion of said substrate adjacent second n-well; and said substrate distributes a second potential.

23. The system of claim 21, wherein:
said first ring oscillator module is formed in said triple-well structure; and
said second ring oscillator module is formed in said single-well structure.

24. A method of validating a design for use in fabricating an integrated circuit comprising:
forming a first test structure according to a first design rule;
forming a second test structure according to a second design rule;
coupling a first ring oscillator module to said first test structure, wherein a first operating frequency of said first ring oscillator module is a function of said first design rule and not said second design rule; and
coupling a second ring oscillator module to said second test structure, wherein a second operating frequency of said second ring oscillator module is a function of said second design rule and not said first design rule.

25. The method according to claim 24, further comprising comparing an operating frequency of said first oscillator signal to an operating frequency of said second oscillator signal.

26. The method according to claim 24, wherein:
said first test structure comprises a first triple-well structure; and
said second test structure comprises a second triple-well structure.

27. The method according to claim 26, wherein:
coupling said first ring oscillator module to said first test structure comprises fabricating said first ring oscillator module in said first triple-well structure; and
coupling said second ring oscillator module to said second test structure comprises fabricating said second ring oscillator module in said second triple-well structure.

28. The method according to claim 24, wherein:
said first test structure comprises a triple-well structure; and
said second test structure comprises a single-well structure.

29. The method according to claim 28, wherein:
coupling said first ring oscillator module to said first test structure comprises fabricating said first ring oscillator module in said triple-well structure; and
coupling said second ring oscillator module to said second test structure comprises fabricating said second ring oscillator module in said single-well structure.

30. A method of determining a parameter in an integrated circuit comprising:
distributing a potential reduced by a first voltage drop;
distributing said potential reduced by a second voltage drop;
generating a first oscillator signal as a function of said potential reduced by said first voltage drop and not said second voltage drop; and
generating a second oscillator signal as a function of said potential reduced by said second voltage drop and not said first voltage drop.

31. The method according to claim 30, further comprising generating said potential.

32. The method according to claim 30, wherein:
said first voltage drop is a function of a first distribution system; and
said second voltage drop is a function of a second distribution system.

33. The method according to claim 30, further comprising generating an output signal as a function of a difference between a first operating frequency of said first oscillator signal and a second operating frequency of said second oscillator signal.

34. The method according to claim 32, further comprising trimming a voltage level of said potential as a function of said output signal.

35. The method according to claim 34, wherein said potential is a back-bias voltage.

* * * * *